United States Patent
Yamada et al.

(10) Patent No.: US 8,552,624 B2
(45) Date of Patent: Oct. 8, 2013

(54) IMPACT RESISTANCE VIBRATING REED, VIBRATOR, OSCILLATOR, AND ELECTRONIC DEVICE

(75) Inventors: Akinori Yamada, Ina (JP); Shuhei Yoshida, Kamiina (JP)

(73) Assignee: Seiko Epson Corporation (JP)

( * ) Notice: Subject to any disclaimer, the term of this patent is extended or adjusted under 35 U.S.C. 154(b) by 386 days.

(21) Appl. No.: 12/884,579

(22) Filed: Sep. 17, 2010

(65) Prior Publication Data

US 2011/0068876 A1 Mar. 24, 2011

(30) Foreign Application Priority Data

Sep. 18, 2009 (JP) ................... 2009-216634
Mar. 24, 2010 (JP) ................... 2010-068997
Jul. 14, 2010 (JP) ................... 2010-159503

(51) Int. Cl.
*H03H 9/19* (2006.01)
(52) U.S. Cl.
USPC ........................................................ 310/370
(58) Field of Classification Search
USPC ........................................................ 310/370
See application file for complete search history.

(56) References Cited

U.S. PATENT DOCUMENTS

| | | | | |
|---|---|---|---|---|
| RE29,763 E | * | 9/1978 | Kawai | ............................ 310/344 |
| 7,675,224 B2 | | 3/2010 | Tanaya | |
| 8,110,965 B2 | * | 2/2012 | Iwai et al. | ...................... 310/370 |
| 2002/0125794 A1 | | 9/2002 | Tanaya et al. | |
| 2004/0263027 A1 | | 12/2004 | Kawashima | |
| 2005/0062368 A1 | * | 3/2005 | Hirasawa et al. | ............. 310/370 |
| 2009/0021120 A1 | | 1/2009 | Dalla Piazza et al. | |
| 2009/0077781 A1 | * | 3/2009 | Amano | ......................... 29/25.35 |
| 2009/0167118 A1 | | 7/2009 | Yoshimatsu et al. | |

FOREIGN PATENT DOCUMENTS

| | | |
|---|---|---|
| JP | 2002-185282 | 6/2002 |
| JP | 2002-280870 | 9/2002 |
| JP | 2005-005896 | 1/2005 |
| JP | 2005-039767 | 2/2005 |
| JP | 2006-197477 | 7/2006 |
| JP | 2006311088 A | * 11/2006 |
| JP | 2007-049748 | 2/2007 |
| JP | 2009-027711 | 2/2009 |
| JP | 2009-118302 A | 5/2009 |
| JP | 2009-164777 A | 7/2009 |
| JP | 2010-050960 A | 3/2010 |
| JP | 2011205266 A | * 10/2011 |
| JP | 2011239132 A | * 11/2011 |
| JP | 2012039226 A | * 2/2012 |
| KR | 10-2006-0113488 | 11/2006 |

* cited by examiner

*Primary Examiner* — J. San Martin
(74) *Attorney, Agent, or Firm* — Harness, Dickey & Pierce, P.L.C.

(57) ABSTRACT

A vibrating reed includes: a base; at least one vibrating arm extending from the base; at least one support arm extending from the base, and at least a part of which extends in parallel to the vibrating arm; and at least one receiving section formed of a part of the support arm, the part extending to have a shape of a projection so that a distance from the vibrating arm is reduced.

16 Claims, 7 Drawing Sheets

IMPACT RESISTANCE VIBRATING REED, VIBRATOR, OSCILLATOR, AND ELECTRONIC DEVICE

BACKGROUND

1. Technical Field

The invention relates to a vibrating reed such as a piezoelectric vibrating reed made of a piezoelectric material, a vibrator, an oscillator, and an electronic device using these components.

2. Related Art

In the past, as the vibrating reed vibrating in a flexural vibration mode or other vibration modes, there is widely used a tuning-fork piezoelectric vibrating reed having a pair of vibrating arms extending in parallel to each other from the base of a substrate made of a piezoelectric material such as a quartz crystal so as to vibrate in a direction in which the vibrating arms come closer to and break away from each other. Miniaturization of the various products to be attached with a vibrating device provided with such a vibrating reed such as small-sized information equipment such as hard disk drives (HDD), mobile computers, or IC cards, mobile communication equipment such as cellular phones, car telephones, or paging systems, or vibratory gyro-sensors has been increasingly advanced, and in accordance therewith the demand for miniaturization of the vibrating devices and the vibrating reeds to be incorporated in the vibrating devices have been further increasing.

Further, as another problem of miniaturization, there can be cited the fact that when exciting the vibrating arms of the vibrating reed, a loss is caused in the vibrational energy, which causes degradation in the performance of the vibrating reed such as increase in the crystal impedance (CI) value or decrease in the Q-value. Therefore, in order for further preventing or reducing the loss of the vibrational energy while achieving the miniaturization of the vibrating reed, various devices have been made in the past. For example, there is known a tuning-fork quartz-crystal vibrating reed provided with an elongate groove on the principal surface of the vibrating arms, and cut sections or cuts (cut grooves) with a predetermined depth formed on both sides of the base from which the vibrating arms extend (see, e.g., JP-A-2002-280870 (Document 1)).

Figure 8:
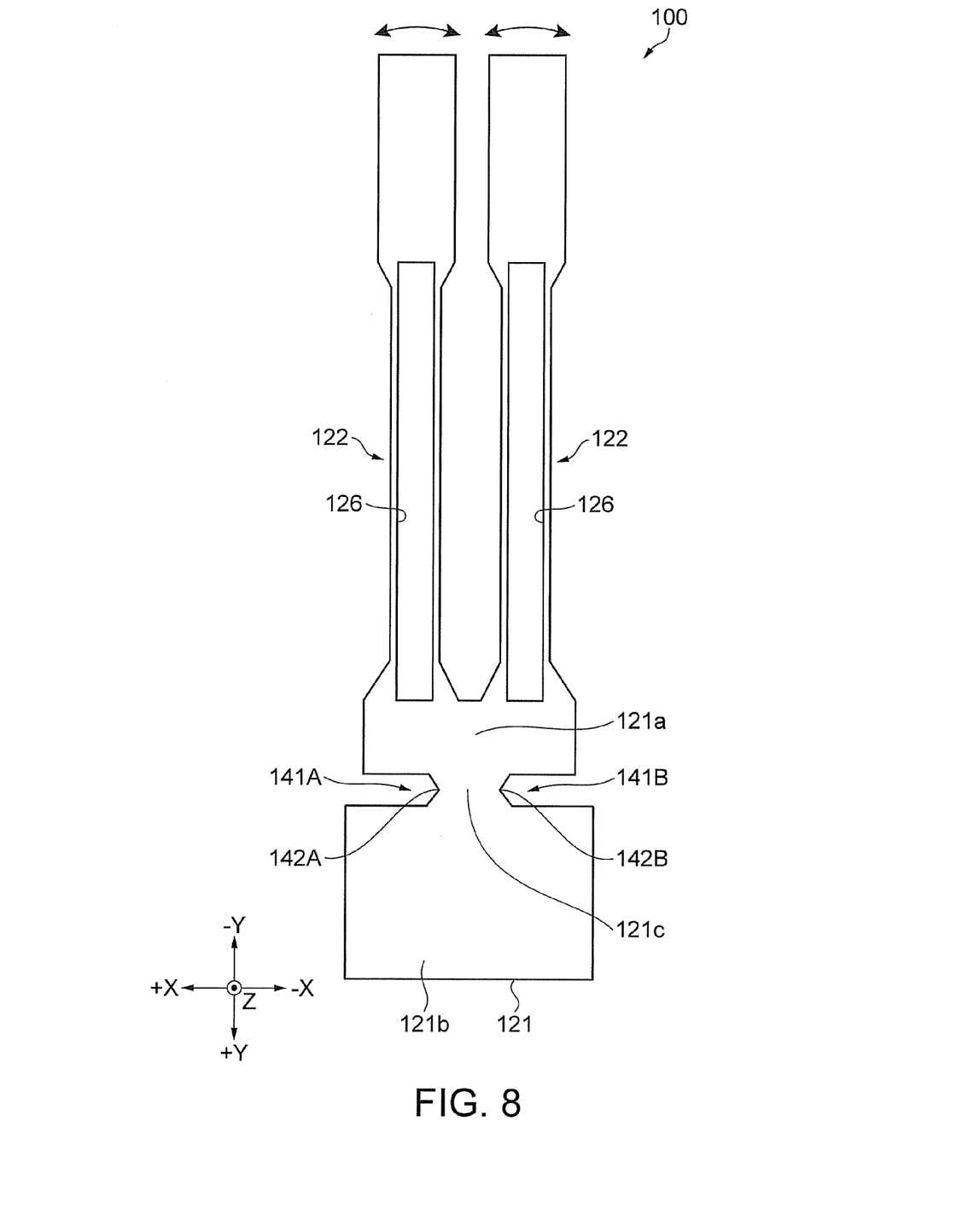
FIG. 8 is a plan view schematically showing the tuning-fork quartz-crystal vibrating reed as a related vibrating reed.

The tuning-fork quartz-crystal vibrating reed described in the Document 1 will specifically be explained with reference to the drawings. FIG. 8 is a plan view schematically showing the tuning-fork quartz-crystal vibrating reed as an example of the vibrating reed of the related art.

In FIG. 8, the tuning-fork quartz-crystal vibrating reed 100 has a base 121 made of a quartz crystal, and a pair of vibrating arms 122 extending in parallel to each other from an end portion of the base 121. Each of the vibrating arms 122 has a pair of principal surfaces of the vibrating arm 122 and a pair of side surfaces connecting the pair of principal surfaces, and further, each of the vibrating arms 122 is provided with a bottomed elongate groove 126 along the longitudinal direction of the vibrating arm 122 with an opening on at least one of the pair of principal surfaces. It should be noted that although not shown in the drawings the area including the elongate groove 126 is provided with an excitation electrode for vibrating the vibrating arm 122.

Further, on the other sides (two sides) in the direction perpendicular to the one end portion of the base 121 from which the vibrating arms 122 extend, there are formed a pair of cuts 141A, 141B in an opposed directions along a single straight line so that a constricted shape appears in both of the principal surfaces of the base 121. The base 121 includes a first portion 121a and a second portion 121b located on both sides across the pair of cuts 141A, 141B, and a connecting portion 121c for connecting the first portion 121a and the second portion 121b between the pair of cuts 141A, 141B. The second portion 121b is provided with an externally-connecting electrode, not shown, used for electrical connection to an external board such as a package. The tuning-fork quartz-crystal vibrating reed 100 is bonded and fixed to the external board such as a package while achieving electrical connection using the second portion 121b of the base 121 as a fixing section.

Since the elongate grooves 126 are respectively provided to the vibrating arms 122, the vibrating arms 122 becomes easy to move and vibrates efficiently, the tuning-fork quartz-crystal vibrating reed 100 has a property that the vibrational loss can be reduced and the CI value can be suppressed to a low level.

Further, in the case in which the vibration of the vibrating arms 122 includes a vertical direction component, the pair of cuts 141A, 141B provided to the base 121 block the transmission of the vibration of the vibration arms 122, and therefore, a so-called vibration leakage, the phenomenon that the vibration is transmitted to the outside via the base 121, is prevented, which exerts the effect of preventing the increase in the CI value, and at the same time, prevents the variation in the CI value between the vibrating arms 122.

However, in the tuning-fork quartz-crystal vibrating reed 100 described in the Document 1, there arises a problem that the cuts 141A, 141B provided to the base 121 might cause degradation of the rigidity of the base 121 to degrade the impact resistance.

Specifically, in the tuning-fork quartz-crystal vibrating reed 100 shown in FIG. 8, when a predetermined drive voltage is applied to the excitation electrode, the vibrating arms 122 vibrate in a horizontal direction indicated by the arrows in the drawing in which the vibrating arms 122 come closer to and break away from each other. If an impact of significantly displacing the vibrating arms 122 in the direction the same as vibration direction is applied to the tuning-fork quartz-crystal vibrating reed 100, large stress is caused locally on the side of the base 121. In other words, if the tip side of each of the vibrating arms 122 is significantly displaced taking the second portion 121b of the base 121 as a fixed end, the stress is concentrated at a tip portion 142A or a tip portion 142B of the cut 141A or the cut 141B corresponding to the opposite side to the direction in which the vibrating arms 122 are displaced out of the pair of cuts 141A, 141B. In particular, since the quartz crystal has low mechanical strength against the tensile stress, if the impact of significantly displacing the vibrating arms 122 to the +X direction (leftward) indicated by the arrow in the drawing is applied to the tuning-fork quartz-crystal vibrating reed 100, for example, large tensile stress is applied at the tip portion 142B of the cut 141B of the base 121 located in the −X direction (rightward) in the drawing, which might cause a crack or breakage.

SUMMARY

An advantage of some aspects of the invention is to solve at least a part of the problem described above, and the invention can be embodied as the following embodiments or application examples.

Application Example 1

According to this application example of the invention, there is provided a vibrating reed including, a base, at least one vibrating arm extending from the base, at least one support arm extending from the base, and at least a part of which extends in parallel to the vibrating arm, and at least one receiving section formed of a part of the support arm, the part extending to have a shape of a projection so that a distance from the vibrating arm is reduced.

According to this configuration, since the receiving section formed of a part of the support arm extending to form a shape of a projection is disposed so that the distance from the vibrating arm becomes smaller, the displacement of the tip of the vibrating arm is limited by the receiving section when the vibrating arm is displaced beyond the vibrational amplitude range of the normal vibration due to, for example, application of an impact to the vibrating reed, and therefore, increase in the stress applied to the root portion of the vibrating arm with the base can be suppressed, and the problem such as occurrence of a crack or a damage can be prevented.

Application Example 2

According to this application example of the invention, in the vibrating reed of the above application example of the invention, the receiving section is opposed to the vibrating arm, and disposed outside a vibrational amplitude range of vibration of the vibrating arm caused by an electric field applied externally, and at a position where the vibrating arm has contact with the receiving section when the vibrating arm is displaced beyond the vibrational amplitude range.

According to this configuration, since the displacement of the tip of the vibrating arm is limited by the receiving section when the vibrating arm is displaced beyond the vibrational amplitude range of the normal vibration due to, for example, application of an impact to the vibrating reed, increase in the stress applied to the root portion of the vibrating arm with the base can be suppressed, and the problem such as occurrence of a crack or a damage can be prevented.

Application Example 3

According to this application example of the invention, in the vibrating reed of the above application example of the invention, the receiving section is disposed on a tip side of the support arm.

According to this configuration, since the displacement of the tip of the vibrating arm is limited by the receiving section when the vibrating arm is displaced beyond the vibrational amplitude range of the normal vibration due to, for example, application of an impact to the vibrating reed, increase in the stress applied to the root portion of the vibrating arm with the base can be suppressed, and the problem such as occurrence of a crack or a damage can be prevented. Moreover, since the support arm having the receiving section disposed at the tip thereof is provided, by bonding the vibrating reed to an external member such as a package using the support arm, it is possible to make the external member hold the vibrating arm and the base in a floating condition, and therefore, it is possible to prevent that the vibration of the vibrating arm is leaked via the base and that the vibration characteristic becomes unstable due to the transmission of unwanted vibration to the vibrating arm via the base. Therefore, it becomes possible to provide the vibrating reed having the stable vibration characteristic and the superior impact resistance.

Application Example 4

According to this application example of the invention, in the vibrating reed of the above application example of the invention, two or more of the receiving sections are disposed on the support arm, and are configured so as to have contact with the vibrating arm at two or more positions in a longitudinal direction of the vibrating arm due to bending deformation of the vibrating arm.

According to this configuration, it is arranged that when the bending deformation is caused in the vibrating arm, the vibrating arm has contact with the receiving sections disposed on the support arm at a plurality of positions. Thus, when the vibrating arm and the receiving sections have contact with each other, it is possible to prevent or reduce the impact locally applied to the vibrating arm.

Application Example 5

According to this application example of the invention, in the vibrating reed of the above application example of the invention, the vibrating arm has both principal surfaces and both side surfaces connecting the both principal surfaces to each other and extending in a longitudinal direction of the vibrating arm, the vibrating arm is further provided with at least one bottomed elongate groove having an opening on at least one of the both principal surfaces and extending along the longitudinal direction of the vibrating arm, and the receiving section is arranged so that a contact portion of the vibrating arm with the receiving section formed when the vibrating arm is displaced beyond the vibrational amplitude range of the normal vibration and has contact with the receiving section is located closer to the tip than an area where the elongate groove is formed.

According to this configuration, since it is arranged that the contact portion of the vibrating arm with the receiving section formed when the displacement of the vibrating arm is limited by the receiving section is located at the portion closer to the tip thereof and having higher rigidity than the area of the vibrating arm where the elongate groove is formed while preventing the increase in the CI value by making the vibrating arm easy to move using the elongate groove to thereby vibrate efficiently, the breakage of the vibrating arm can be prevented.

Application Example 6

According to this application example of the invention, in the vibrating reed of the above application example of the invention, a weight section having a width larger than that of the base side of the vibrating arm is disposed on the tip side of the vibrating arm, and a contact portion of the receiving section with the vibrating arm when a displacement exceeding the vibrational amplitude range of the normal vibration is caused in the vibrating arm and has contact with the receiving section is arranged to have contact with the weight section.

According to this configuration, since the side surface of the weight section corresponding to the wide portion of the vibrating arm and having high mechanical strength is used as the contact portion, it is possible to improve the impact resistance while preventing the damage of the vibrating arm.

Application Example 7

According to this application example of the invention, in the vibrating reed of the above application example of the invention, the contact portion of the receiving section is arranged to have surface-contact with a side surface of the weight section of the vibrating arm.

The impact resistance of the vibrating reed can be improved while preventing the pressure of the impact from being concentrated by the corner section to thereby break the corner section or a part of the receiving section, which might be caused in the case in which the corner section of the vibrating arm formed by the weight section is arranged so as to have contact with the contact portion of the receiving section, for example.

Application Example 8

According to this application example of the invention, in the vibrating reed of the above application example of the invention, the support arm has a part having a width smaller than a distance between the both side surfaces of the vibrating arm at a part having the smallest distance.

According to this configuration, since the support arm becomes easier to bend than the vibrating arm, and therefore, the damage caused in the vibrating arm when the vibrating arm hits the receiving section of the support arm is reduced, the vibrating reed having a high impact resistance can be provided while preventing breakage of the vibrating arm.

Application Example 9

According to this application example of the invention, in the vibrating reed of the above application example of the invention, the support arm is formed so that the width of the receiving section is smaller than a width of the support arm on the base side.

According to this configuration, the tip side of the support arm having the receiving section becomes easier to bend than the base side of the support arm, the damage caused in the vibrating arm when the vibrating arm hits the receiving section of the support arm is reduced, and this contributes to improvement of the impact resistance of the vibrating reed while preventing the breakage of the vibrating arm.

Application Example 10

According to this application example of the invention, in the vibrating reed of the above application example of the invention, the vibrating reed is a piezoelectric vibrating reed formed of a piezoelectric material.

According to this configuration, the piezoelectric vibrating reed such as a quartz-crystal vibrating reed having a high impact resistance and a superior vibration characteristic can be provided.

Application Example 11

According to this application example of the invention, in the vibrating reed of the above application example of the invention, a quartz crystal is used as the piezoelectric material, the base has a pair of cuts arranged in respective directions opposite to each other along one straight line in an X-axis direction in an orthogonal coordinate system constituted by the X axis, Y axis, and Z axis of the quartz crystal so that a constricted shape appears in both principal surfaces of the base, the vibrating arm extends in the Y-axis direction from an end of the base located in the Y-axis direction, and the support arm having the receiving section is disposed at least on a +X side of the vibrating arm.

The quartz crystal is widely used as a piezoelectric material of the piezoelectric vibrating reed, and when forming a cut along the X-axis direction in the orthogonal coordinate system of the crystal axes as in the configuration described above using an etching process, a so-called fin section such as an unwanted hole section or an unwanted etching residue section is provided to the tip portion (the corner section) of the inside wall of the cut formed by performing a cutting process from the −X side due to the etching anisotropy with respect to the crystal axes of the quartz crystal. The fin section in the cut can be a trigger for the crack or breakage when the impact is applied to the vibrating reed, and in particular, when the tensile stress is applied to the fin section, the fin section becomes a remarkable strength deterioration factor.

According to the configuration of this application example of the invention, it is configured that in the vibrating reed made of a quartz crystal, the support arm extends from the end of the base on the opposite side (+X direction) to the cut in the −X direction in which the fin section is caused, and the receiving section is provided on the tip side of the support arm. Thus, since the receiving section for limiting the movement of the vibrating arm displaced in the direction in which the tensile stress is applied to the fin section is formed, it is possible to improve the impact resistance with respect to the displacement direction with particularly weak impact resistance. Further, in the case in which the configuration of forming the support arm having the receiving section from either one end of the base is adopted, miniaturization of the vibrating reed can be achieved compared to the case in which the support arm is formed also from the other end, and the receiving section is further provided to the support arm.

Application Example 12

According to this application example of the invention, in the vibrating reed of the above application example of the invention, a contact portion of the receiving section is provided with a shock absorbing member.

According to this configuration, since the impact is reduced by the shock absorbing member when the vibrating arm hits the receiving section, the vibrating arm can be prevented from being dropped out or damaged.

Application Example 13

According to application example of the invention, there is provided a vibrator including the vibrating reed according to any one of the application examples of the invention described above, and a package adapted to house the vibrating reed.

According to this configuration, since the vibrating reed described in the above application examples of the invention is provided, it becomes possible to provide the vibrator having a stable vibration characteristic, and a high impact resistance.

Application Example 14

According to this application example of the invention, there is provided an oscillator including the vibrating reed according to any one of the application examples of the invention described above, a circuit element provided with an oscillator circuit adapted to oscillate the vibrating reed, and a package adapted to house the vibrating reed and the circuit element.

According to this configuration, since the vibrating reed described in the above application examples of the invention is provided, it becomes possible to provide the oscillator having a stable vibration characteristic, and a high impact resistance.

Application Example 15

According to this application example of the invention, there is provided an electronic device including one of the vibrating reed according to either one of the above application examples of the invention, the vibrator according to the above application example of the invention, and the oscillator according to the above application example of the invention.

According to this configuration, it becomes possible to provide an electronic device vibration characteristic having a stable characteristic and assuring the impact resistance.

Application Example 16

According to this application example of the invention, there is provided a vibrating reed including a base, at least one vibrating arm extending from one end portion of the base, at least one support arm extending from the other end portion of the base, and at least a part of which extends in parallel to the vibrating arm, and a receiving section disposed on a tip side of the support arm, disposed outside a vibrational amplitude range of normal vibration of the vibrating arm, and disposed at a position where the vibrating arm has contact with the receiving section when the vibrating arm is displaced beyond the vibrational amplitude range of the normal vibration.

According to this configuration, since the displacement of the tip of the vibrating arm is limited by the receiving section when the vibrating arm is displaced beyond the vibrational amplitude range of the normal vibration due to, for example, application of an impact to the vibrating reed, increase in the stress applied to the root portion of the vibrating arm with the base can be suppressed, and the problem such as occurrence of a crack or a damage can be prevented. Moreover, since the support arm having the receiving section disposed at the tip thereof is provided, by bonding the vibrating reed to an external member such as a package using the support arm, it is possible to make the external member hold the vibrating arm and the base in a floating condition, and therefore, it is possible to prevent that the vibration of the vibrating arm is leaked via the base and that the vibration characteristic becomes unstable due to the transmission of unwanted vibration to the vibrating arm via the base. Therefore, it becomes possible to provide the vibrating reed having the stable vibration characteristic and the superior impact resistance.

BRIEF DESCRIPTION OF THE DRAWINGS

The invention will be described with reference to the accompanying drawings, wherein like numbers reference like elements.

FIGS. 2A through 2C are diagrams for schematically explaining cross-sectional surfaces of respective portions of the quartz-crystal vibrating reed, wherein

FIGS. 6A and 6B are schematic diagrams showing a rough configuration of a vibrator according to a third embodiment, wherein

FIGS. 7A and 7B are schematic diagrams showing a rough configuration of an oscillator according to a fourth embodiment, wherein

DESCRIPTION OF EXEMPLARY EMBODIMENTS

Hereinafter, some embodiments of a vibrating reed according to the invention will be explained with reference to the accompanying drawings.

First Embodiment

Figure 1:
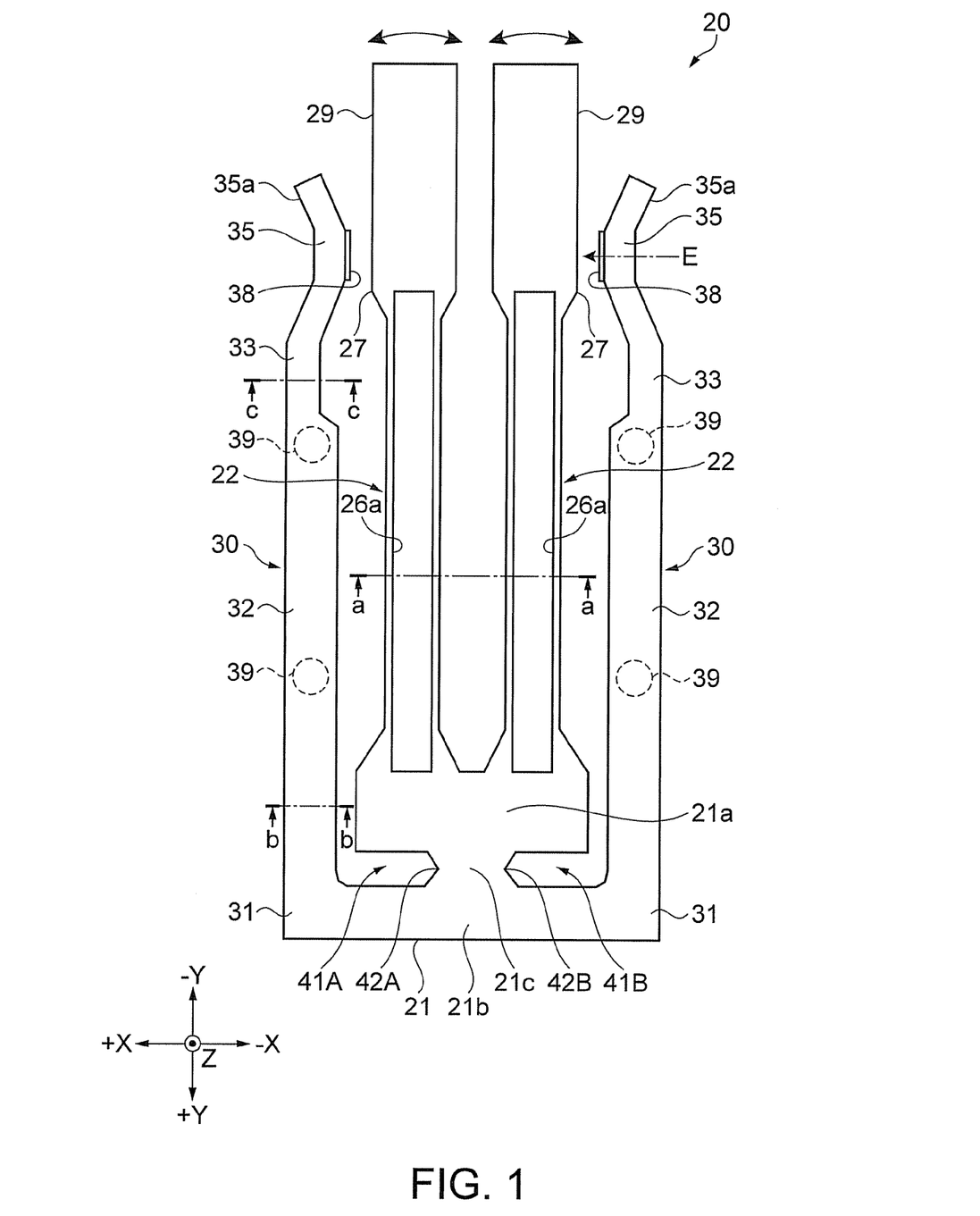
FIG. 1 is a plan view of a quartz-crystal vibrating reed as a vibrating reed according to a first embodiment viewed from one of the principal surfaces and for schematically explaining the quartz-crystal vibrating reed.
Figure 2A:
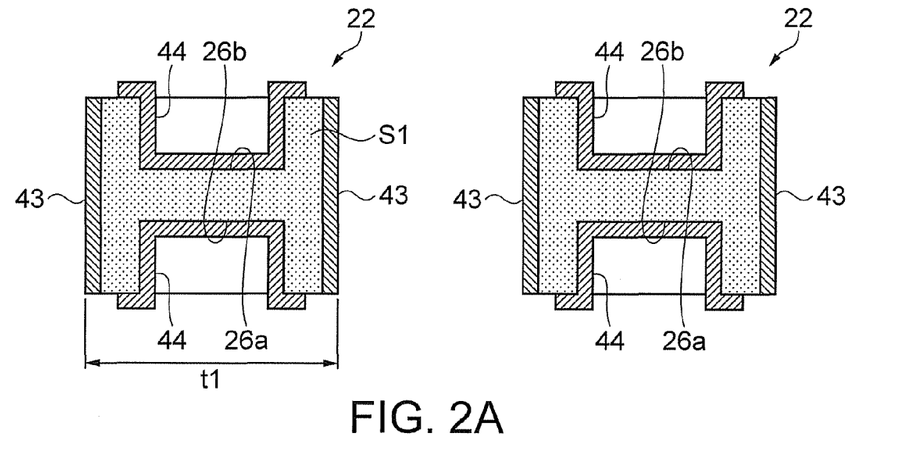
FIG. 2A is a cross-sectional view along the line a-a shown in FIG. 1.
Figure 2B:
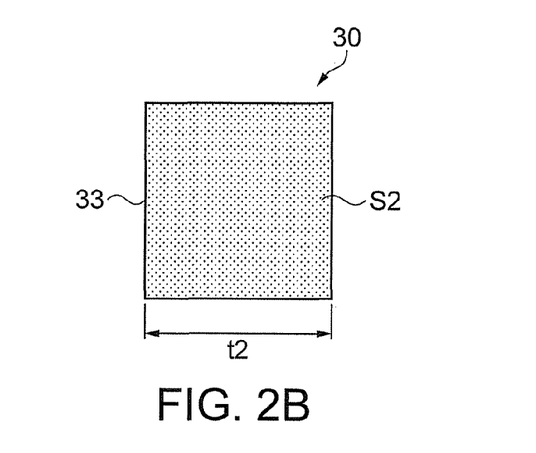
FIG. 2B is a cross-sectional view along the line c-c shown in FIG. 1.
Figure 2C:
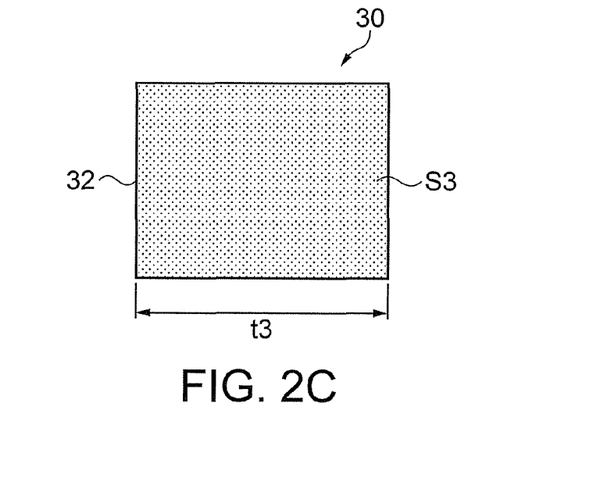
FIG. 2C is a cross-sectional view along the line b-b shown in FIG. 1.

FIG. 1 is a plan view of a quartz-crystal vibrating reed as a vibrating reed according to the first embodiment viewed from one of the principal surfaces and for schematically explaining the quartz-crystal vibrating reed. FIGS. 2A through 2C are for schematically explaining cross-sectional surfaces of respective portions of the quartz-crystal vibrating reed, wherein FIG. 2A is a cross-sectional view along the line a-a shown in FIG. 1, FIG. 2B is a cross-sectional view along the line c-c shown in FIG. 1, and FIG. 2C is a cross-sectional view along the line b-b shown in FIG. 1.

In the present embodiment, the explanation will be presented using the example of adopting a quartz crystal as the piezoelectric material.

In FIG. 1, the quartz-crystal vibrating reed 20 is a piezoelectric vibrating reed made of a quartz crystal. Further, as the quartz-crystal wafer (the quartz-crystal substrate) forming an original shape of the quartz crystal constituting the quartz-crystal vibrating reed 20 of the present embodiment, there is used what is obtained by performing a cutting and polishing process on a quartz-crystal "Z" plate, which is cut out while being rotated clockwise around the Z-axis within a range from 0 degree to 5 degrees in the orthogonal coordinate system constituted by the X-axis, the Y-axis, and the Z-axis, to have a predetermined thickness. The quartz-crystal vibrating read 20 of the present embodiment is formed to have an outer shape of a so-called tuning-fork type composed of a base 21 formed by processing the quartz-crystal "Z" plate and a pair of vibrating arms 22 forked from one end (the upper end in the drawing) of the base 21 and extending in parallel to each other.

The base 21 is provided with a pair of cuts 41A, 41B formed in the opposed directions along a single straight line so that a constricted shape appears in the both principal surfaces. The base 21 includes a first portion 21a and a second portion 21b located on both sides across the pair of cuts 41A, 41B, and a connecting portion 21c for connecting the first portion 21a and the second portion 21b between the pair of cuts 41A, 41B.

In the quartz-crystal vibrating reed 20 of the present embodiment, since these cuts 41A, 41B block transmission of the vibration of each of the vibrating arms 22, it is possible to reduce a so-called vibration leakage, the phenomenon that the vibration is transmitted to the outside via the base 21 and support arms 30 described later, to thereby prevent increase in the CI value.

It should be noted that the distance (the width of the connecting portion 21c) between the pair of cuts 41A, 41B can beset smaller or larger than the distance between the side surfaces of the pair of vibrating arms 22 opposed to each other, or smaller or larger than the distance between the side surfaces of the pair of vibrating arms 22 facing to directions opposite to each other.

The pair of vibrating arms 22 extend from the first portion 21a of the base 21 in parallel to the both principal surfaces (the surfaces located on the front side and the back side of the sheet). Further, each of the vibrating arms 22 has the both principal surfaces described above and the both side surfaces connecting the both principal surfaces on the both sides.

Further, on the tip side of each of the vibrating arms 22, there is provided a weight section 29 having a width larger than that of the part of the vibrating arm 22 nearer to the base 21. As described above, due to the weight sections 29 on the tip portions of the respective vibrating arms 22 functioning as weights, it is possible to lower the frequency without increasing the length of the vibrating arms 22.

It should be noted that although the configuration in which the part of each of the vibrating arms other than the weight section 29 has a constant width is illustrated, the vibrating arms 22 of the present embodiment is not limited to this configuration, but it is also possible that the substantial part (the part other than the weight section 29) of each of the vibrating arms 22 has a shape tapering toward the tip thereof. For example, by forming a tapered part tapering from the side of the base 21 of each of the vibrating arms 22 toward the tip thereof, it is possible to make the vibrating arms 22 easy to vibrate.

As shown in FIG. 1, one of the principal surfaces of each of the vibrating arms 22 is provided with a bottomed elongate groove 26a along the longitudinal direction thereof. Further, as shown in FIG. 2A, the other of the principal surfaces of each of the vibrating arms 22 is also provided with an elongate groove 26b along the longitudinal direction of the vibrating arm 22.

Since the vibrating arms 22 become easy to move and thus vibrate efficiently due to the elongate grooves 26a, 26b provided to each of the vibrating arms 22, the CI value can be lowered.

It should be noted that in the vibrating arms 22 of the present embodiment shown in FIG. 1, the elongate groove 26a (and the elongate groove 26b) is formed so that one end (on the tip side of the vibrating arm 22) thereof reaches the position on the tip side (the side of the weight section 29) beyond the boundary with the weight section 29 of the vibrating arm 22. By adopting the configuration described above, the area in which the stress caused when the vibrating arms 22 vibrate is concentrated is dispersed in the direction in which the vibrating arms 22 extend, and therefore, the problem that the stress is concentrated at the root portion of the weight section 29 of each of the vibrating arms 22 to cause breakage can be avoided.

By contraries, it is also possible to adopt the configuration of forming the elongate grooves 26a, 26b so that one end (the tip side of the vibrating arm 22) thereof reaches the position on the side of the base 21 from the boundary with the weight section 29 of the vibrating arm 22, and some advantages can be obtained accordingly. Specifically, the area in which the stress caused when the vibrating arms 22 vibrate is concentrated is dispersed in the direction in which the vibrating arms 22 extend, thereby making it possible to avoid the problem that the stress is concentrated at the root portion of the weight section 29 of each of the vibrating arms to cause breakage, and at the same time, since the mass-adding effect of the weight section 29 in each of the vibrating arms 22 is enhanced, it is possible to achieve the lower frequency without increasing the size of the quartz-crystal vibrating reed 20.

It should be noted that in each of the vibrating arms 22, if the breakage due to the stress concentration to the root portion of the weight section 29 of the vibrating arm 22 does not occur even in the case in which the elongate grooves 26a, 26b are formed so that one end (the tip side of the vibrating arm 22) of the elongate grooves 26a, 26b is located at the boundary with the weight section 29 of the vibrating arm 22, namely if, for example, the vibrating arms 22 each have a width enough for providing sufficient rigidity, or if the shape (e.g., a tapered shape) having a width increasing from the side of the base 21 of the vibrating arm 22 toward the weight section 29 is formed, it is possible to provide one end (the tip side of the vibrating arm 22) of the elongate grooves 26a, 26b so as to be located at the boundary with the weight section 29 of the vibrating arm 22.

The quartz-crystal vibrating reed 20 has a pair of support arms 30 extending from the second portion 21b of the base 21. The pair of support arms 30 extend from two ends located in a direction intersecting the direction, in which the pair of vibrating arms 22 extend from the base 21, in the respective directions opposite to each other, and are then inflected at flexural areas 31 toward the direction in which the pair of vibrating arms 22 extend, and then further extend. By thus making the flexural areas, the support arms 30 are downsized. The support arms 30 are portions used for attachment with an external board such as a package (not shown), and are attached to the external board by bonding to fix the fixing sections 39 shown in the drawing as examples and the fixing sections of the external board via an adhesive or the like. Thus, it becomes possible to keep the vibrating arms 22 and the base 21 in a floating state in the quartz-crystal vibrating reed 20 attached to the external board.

As shown in FIGS. 2A through 2C, there are formed excitation electrodes 44 on the surfaces including the elongate grooves 26a, 26b of each of the vibrating arms 22, and excitation electrodes 43 on the surfaces including the respective side surfaces (illustrations are omitted in FIG. 1). In one of the vibrating arms 22, a voltage is applied between the excitation electrodes 43, 44 to elongate and contract the both side surfaces of the vibrating arm 22, thereby vibrating the vibrating arm 22. The excitation electrodes 43, can be formed by forming the outer shape of the quartz-crystal vibrating reed 20 including the elongate grooves 26a, 26b by etching the quartz crystal, then forming a foundation layer made of, for example, nickel (Ni) or chromium (Cr), forming an electrode layer made of, for example, gold (Au) thereon by evaporation or sputtering, and then patterning the electrode layer using a photolithography process. Here, chromium has a high adhesiveness with the quartz crystal, and gold is known as having low electrical resistance and being difficult to be oxidized.

On the tip side of each of the support arms 30, there is provided a portion with smaller thickness in the same direction as the vibration direction of the vibrating arms 22, and a part thereof is provided with a receiving section 35 formed to be vent toward the vibrating arm 22 so that the distance between the support arm 30 and the vibrating arm 22 is reduced. In other words, the receiving section 35 forms a convex section obtained by forming a part of the support arm 30 to have a shape of a projection toward the vibrating arm 22 from the extending direction of the support arm 30. The receiving section 35 is disposed outside the vibrational amplitude range of the normal vibration of the adjacent vibrating arm 22, and at the same time, disposed at a position having contact with the vibrating arm 22 if the displacement exceeding the normal vibrational amplitude range as much as a predetermined amount is caused in the adjacent vibrating arm 22. It should be noted that the vibrational amplitude range of the normal vibration of the vibrating arm 22 described above denotes the vibrational range of the vibrating arm 22 when the vibrational amplitude of the vibrating arm 22 vibrating at a predetermined resonant frequency due to application of the drive voltage (electrical field) to the excitation electrodes 43, 44 of the quartz-crystal vibrating reed 20 becomes the maximum. In other words, the receiving section 35 of the support arm 30 is disposed so as not to have contact with the adjacent vibrating arm 22 even when the vibrational amplitude of the vibrating arm 22 vibrating at the predetermined resonant frequency becomes the maximum. Further, the case in which the displacement exceeding the normal vibrational amplitude range as much as a predetermined amount is caused in the vibrating arm 22 denotes, for example, the case in which the vibrating arm 22 is significantly displaced by application of an impact to the quartz-crystal vibrating reed 20 due to dropping and so on.

In the quartz-crystal vibrating reed 20 shown in FIG. 1, each of the support arms 30 is formed to have a portion with a thickness smaller than the distance between the both side surfaces of the adjacent vibrating arm 22 at the portion thereof having the smallest distance.

Further, each of the support arms 30 is formed so that the widths of the receiving section 35 and the vicinity thereof on the side of the base 21 are smaller than the width of a portion of the support arm 30 near to the base 21.

In a detailed explanation, the pair of support arms 30 extending from the base 21 in the respective directions opposite to each other and then inflected in the flexural areas 31 to extend in a direction parallel to the vibrating arms 22 shown in FIG. 1 each has a wide portion 32 with a relatively large width on the side of the base 21, a narrow portion 33 with a reduced width formed on the tip side of the wide portion 32, and the receiving section 35 formed further on the tip side of the narrow portion 33. In other words, in the width t2 of the narrow portion 33 of the support arm 30 shown in FIG. 2B and the width t3 of the wide portion 32 of the support arm 30 shown in FIG. 2C, the relationship of t2<t3 is satisfied. It should be noted that in the case in which each of the wide portion 32 and the narrow portion 33 of each of the support arms 30 has, for example, a bottomed groove, or a cross-sectional shape not line-symmetric with respect to an imaginary centerline of the cross-sectional surface instead of the rectangular cross-sectional shape as in the present embodiment, it is also possible in the cross-sectional area S2 of the narrow portion 33 of the support arm 30 shown in FIG. 2B and the cross-sectional area S3 of the wide portion 32 of the support arm 30 shown in FIG. 2C to satisfy the relationship of S2<S3.

Further, in the relationship between the distance t1 between the both side surfaces of the vibrating arm 22 shown in FIG. 2A and the width of the support arm 30 in the same direction, at least the relationship of t1>t2 is satisfied with respect to the width t2 of the narrow portion 33 of the support arm 30 shown in FIG. 2B. Further, in the present embodiment, also in the width t1 of the vibrating arm 22 and the width t3 of the wide portion 32 of the support arm 30 shown in FIG. 2C, the relationship of t1>t3 is satisfied. It should be noted that in the cross-sectional area S1 of the vibrating arm 22 shown in FIG. 2A and at least the cross-sectional area S2 of the narrow portion 33 of the support arm 30 shown in FIG. 2B, the relationship of S1>S2 is satisfied. Further, it is also possible that in the cross-sectional area S1 of the vibrating arm 22 and the cross-sectional area S3 of the wide portion 32 of the support arm 30 shown in FIG. 2C, the relationship of S1>S3 is satisfied.

As described above, in the quartz-crystal vibrating reed 20, since each of the support arms 30 is formed to have the narrow portion 33 (and the wide portion 32) having the width smaller than the distance between the both side surfaces of the adjacent vibrating arm 22 at the portion with the smallest distance, the support arm 30 presents elasticity with which the support arm 30 is easier to be distorted than the vibrating arm 22. Thus, since the damage caused to the vibrating arm 22 when the vibrating arm 22 is significantly displaced toward the support arm 30 to hit the receiving section 35 is reduced, it is possible to limit the excessive displacement of the vibrating arms 22 while preventing the breakage of the vibrating arms 22 to thereby improve the impact resistance of the quartz-crystal vibrating reed 20.

Further, since the support arm 30 is formed so that the widths t2 of the receiving section 35 and the narrow portion 33 in the vicinity of the receiving section 35 on the side of the base 21 is smaller than the width t3 of the wide portion 32 of the support arm 30 on the side of the base 21, the tip portion (the side of the narrow portion 33) of the support arm 30 having the receiving section 35 presents the elasticity with which the support arm 30 can be distorted easier than the side (the side of the wide portion 32) of the base 21 of the support arm 30, and therefore, the damage to be caused to vibrating arm 22 when the vibrating arm 22 is significantly displaced toward the support arm 30 to hit the receiving section 35 is reduced, and this contributes to improvement of the impact resistance of the quartz-crystal vibrating reed 20 while preventing the breakage of the vibrating arms 22.

Further, in the present embodiment, the narrow portion 33 having the width of each of the support arms 30 reduced is vent in the direction in which the narrow portion comes closer to the adjacent vibrating arm 22 on the tip side thereof, and then further inflected so as to be parallel to the adjacent vibrating arm 22 on the tip side thereof to thereby form the receiving section 35.

Further, in the present embodiment, a returning section 35a inflected in the direction in which the distance from the adjacent vibrating arm 22 increases is provided to the support arm 30 on the tip side thereof from the receiving section 35 so that the returning section 35a including the corner portion at the tip-most section of the support arm 30 does not have contact with the vibrating arm 22, and thus cracks and breakage are prevented from being caused in the support arms 30 and the vibrating arms 22.

It should be noted that in the configuration of the support arms 30 provided with the receiving sections 35 described above, the fixing sections 39 for fixing the quart-crystal vibrating reed 20 to the external board such as a package are disposed in the wide portion 32 of the support arm 30, and on the side of the base 21 thereof from the receiving section 35. Thus, the receiving section 35 for limiting the displacement of the vibrating arms 22 using the fixing section 39 as supporting points while absorbing the impact can be realized.

Figure 3:
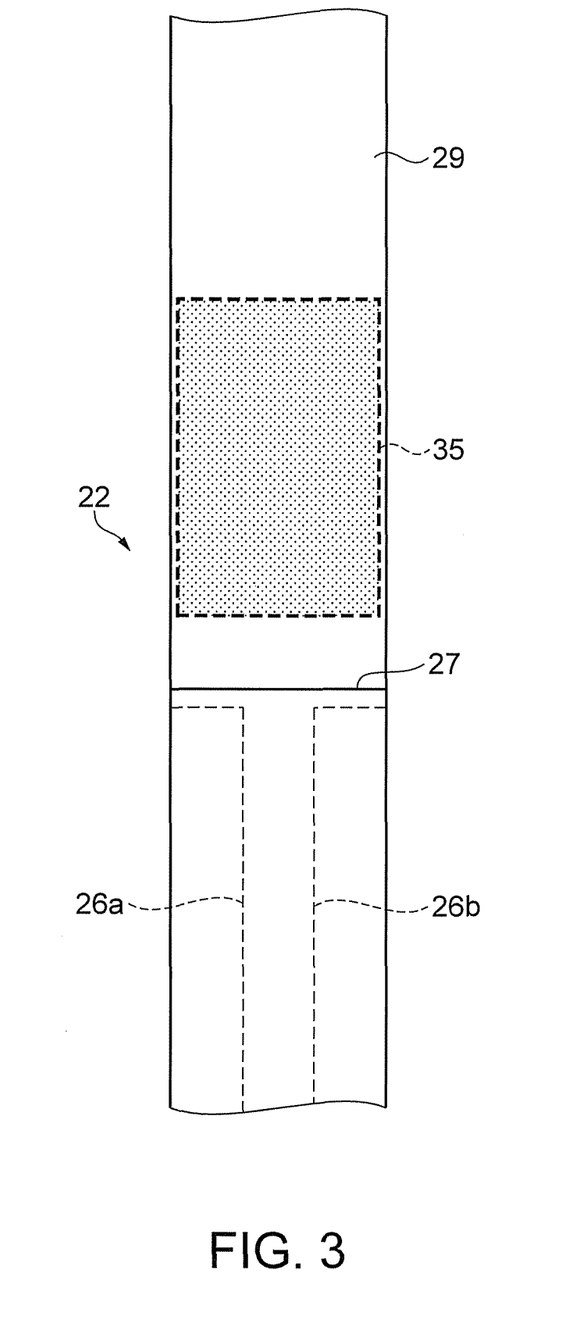
FIG. 3 is a partial enlarged view of a part of the side surface of the vibrating arm viewed from the direction of the arrow E shown in FIG. 1.

The layout of the receiving section 35 in the quartz-crystal vibrating reed 20 will further be explained with reference to FIGS. 1 and 3. FIG. 3 newly referred to here is for schematically explaining the layout of a contact portion of the vibrating arm 22 having contact with the receiving section 35 of the support arm 30, and is a partial enlarged view of a part of the side surface of one of the vibrating arms 22 viewed from the direction indicated by the arrow E shown in FIG. 1.

In the quartz-crystal vibrating reed 20 shown in FIGS. 1 and 3, the receiving section 35 is disposed so that the contact portion of the receiving section 35, which has contact with the vibrating arm 22, is located as described below when the vibrating arm 22 is significantly displaced toward the adjacent support arm 30 so as to have contact with the receiving section 35 of the support arm 30.

Specifically, the receiving section 35 of the support arm 30 is disposed so as to be located on the side closer to the tip than the area provided with the elongate grooves 26a, 26b when the vibrating arm 22 is significantly displaced. Thus, since the contact portion of the vibrating arm 22 having contact with the receiving section 35 when the significant displacement is caused in the vibrating arm 22 and the vibrating arm 22 has contact with the receiving section 35 of the adjacent support arm 30 is disposed so as to be located at the portion, which is located on the side closer to the tip than the area where the elongate grooves 26a, 26b are formed, and has high rigidity, there is exerted an effect on the improvement of the impact resistance of the quartz-crystal vibrating reed 20 while preventing the problem such as breakage of the vibrating arm 22.

Further, the receiving section 35 of the support arm 30 is disposed at the position where the receiving section 35 has contact with the weight section 29 as the wide portion of the vibrating arm 22 located on the tip side when the vibrating arm 22 is displaced significantly. Further, the receiving section 35 is disposed so as to have surface-contact with the side surface located on the side of the receiving section 35 out of the both side surfaces of the weight section 29 of the vibrating arm 22. In other words, in the quartz-crystal vibrating reed 20, the receiving section 35 of the support arm 30 is disposed avoiding the corner section 27 formed at one end of the weight section 29 of the vibrating arm 22. Thus, since the side surface of the weight section 29 corresponding to the wide portion of the vibrating arm 22 and having high rigidity has surface-contact with the receiving section 35, damages of the vibrating arm 22 can be prevented. Further, the impact resistance of the quartz-crystal vibrating reed 20 can be improved while preventing the breakage of a part of the corner section 27 or the receiving section 35 caused by the contact, as in the case in which the corner section 27 of the vibrating arm 22 formed by the weight section 29 is disposed so as to have contact with the contact portion of the receiving section 35, by disposing it avoiding the corner section 27.

Further, in the quartz-crystal vibrating reed 20 of the present embodiment, the surface to be the contact portion of the receiving section 35 with the adjacent vibrating arm 22 is provided with a shock absorbing member 38. It is preferable that the shock absorbing member 38 is made of a material capable of absorbing the impact caused when the vibrating arm 22 is significantly displaced to have contact with the receiving section 35, and is disposed in parallel to the surface of the vibrating arm 22 to be the contact portion thereof and having a predetermined area so as to have surface-contact with the contact portion of the vibrating arm 22 while keeping the contact area as large as possible.

As the material used for the shock absorbing member 38, a material having high elasticity such as rubber or resin can be used. In addition, a relatively soft metallic film made of, for example, gold can also be used besides these materials. In the case of forming the shock absorbing member 38 using the metallic film, the shock absorbing member 38 can be provided without increasing the manufacturing process by simultaneously forming the metallic film in the process of forming the electrode such as excitation electrodes 43, 44 of the quartz-crystal vibrating reed 20 (see FIG. 2A).

As described above, by disposing the impact absorbing member 38 to the contact portion of the receiving section 35 with the adjacent vibrating arm 22, the impact caused when vibrating arm 22 hits the receiving section 35 can be absorbed, and thus the vibrating arm 22 or the receiving section 35 of the support arm 30 can be prevented from being dropped out or damaged.

As is explained hereinabove, according to the quartz-crystal vibrating reed 20 of the embodiment described above, since the cuts 41A, 41B, the elongate grooves 26a, 26b, the weight sections 29, and so on are provided, the vibration leakage, the increase in the CI value, and the drop of the Q-value can be prevented, and at the same time, since the receiving section 35 for limiting the displacement of the vibrating arm 22 while absorbing the impact when the a significant displacement is caused in the vibrating arm 22 due to the impact such as dropping of the quartz-crystal vibrating reed 20 is provided, a stable vibration characteristic can be achieved, and at the same time, the quartz-crystal vibrating reed 20 with a high impact resistance can be provided.

The quartz-crystal vibrating reed 20 (the piezoelectric vibrating reed) as the vibrating reed explained in the embodiment described above can also be put into practice as the following modified example.

Modified Example of First Embodiment

In the embodiment described above, the quartz-crystal vibrating reed 20 with the configuration provided with the support arms 30 having the receiving sections 35 on the both sides of the pair of vibrating arms 22 is explained. Besides the above, taking the crystal axis direction of the quartz-crystal material (the piezoelectric material) constituting the quartz-crystal vibrating reed into consideration, improvement of the impact resistance can be achieved by disposing the receiving section on either one side in the vibration direction of the vibrating arm.

Figure 4:
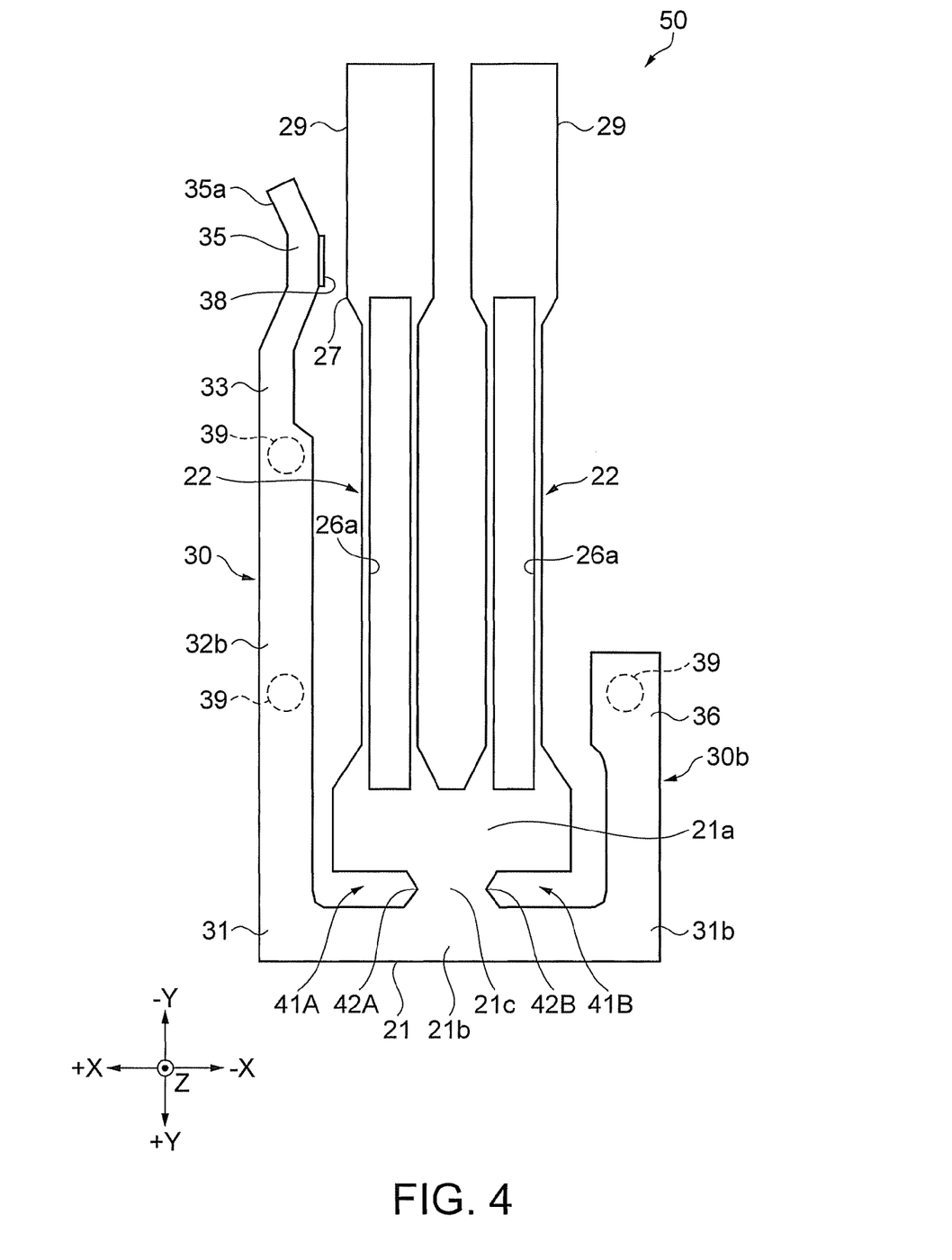
FIG. 4 is a plan view for schematically explaining a modified example of a quartz-crystal vibrating reed as the vibrating reed.

FIG. 4 is a plan view for schematically explaining the modified example of the quartz-crystal vibrating reed having the support arm with the receiving section disposed only on one side in the vibration direction of the vibrating arms. In FIG. 4 for explaining the present modified example, the constituents identical to those of the embodiment described above are denoted with the same reference symbols, and the explanation therefor will be omitted.

In FIG. 4, the quartz-crystal vibrating reed 50 is formed of a quartz-crystal substrate obtained by performing the cutting and polishing process on the quartz-crystal "Z" plate so as to have a predetermined thickness, and is provided with the base 21, and the pair of vibrating arms 22 forked from one end (the end directed upward (the −Y direction) in the drawing) of the base 21 and extending in parallel to each other. The base 21 is provided with the pair of cuts 41A, 41B disposed in the respective directions opposite to each other along the one straight line in the X-axis direction in the orthogonal coordinate system constituted by the X-axis, the Y-axis, and the Z-axis of the quartz crystal so that the constricted shape appears on both of the principal surfaces of the base 21, and the base 21 includes the first portion 21a and the second portion 21b located on both sides across the pair of cuts 41A, 41B, and the connecting portion 21c for connecting the first portion 21a and the second portion 21b between the pair of cuts 41A, 41B.

The pair of vibrating arms 22 are each provided with the weight section 29 as the wide portion located on the tip side thereof. Further, the principal surface of each of the vibrating arms 22 is provided with a bottomed elongate groove 26a along the longitudinal direction thereof. Further, although not shown in the drawings, the excitation electrodes are formed on the surfaces including the elongate groove 26a of each of the vibrating arms 22 and the both side surfaces.

The quartz-crystal vibrating reed 50 has a pair of support arms 30, 30b extending from the second portion 21b of the base 21. The support arms 30, 30b extend from two ends located in a direction intersecting the direction, in which the pair of vibrating arms 22 extend from the base 21, in the respective directions opposite to each other, and are then inflected at flexural areas 31, 31b toward the direction in which the pair of vibrating arms 22 extend, and then further extend.

One (30) of the pair of support arms 30, 30b extending from the end (+X side) of the base 21 on the opposite side to the cut 41B formed by cutting in the −X direction in the orthogonal coordinate system of the quartz crystal has the receiving section 35 on the tip side thereof. In contrast, the other support arm 30b extending from the end of the base 21 on the side of the cut 41B in the −X direction in the orthogonal coordinate system of the quartz crystal is shorter than the one support arm 30 having the receiving section 35, not provided with the receiving section, and is provided with the fixing section 39.

In the quartz-crystal vibrating reed 50 formed of the quartz-crystal "Z" plate, when forming the cut 41B along the −X direction in the orthogonal coordinate system of the crystal axes out of the pair of cuts 41A, 41B formed by cutting in the both directions along the X-axis direction of the base 21 using an etching process, a so-called fin section such as an unwanted hole section or an unwanted etching residue section is provided to the tip portion (the corner section) 42B of the inside wall of the cut 41B due to the etching anisotropy of the quartz-crystal "Z" plate. The fin section caused in the cut 41B might be a trigger of cracking or breaking when an impact is applied to the quartz-crystal vibrating reed 50 due to dropping or the like, and in particular in the case in which the tensile stress is applied to the fin section, namely in the case in which the vibrating arm 22 is significantly displaced in the +X direction, the fin section becomes a remarkable strength deterioration factor.

According to the configuration of the quartz-crystal vibrating reed 50 of the present modified example, there is provided a configuration in which the receiving section 35 is disposed on the tip side of the one support arm 30 extending from the end (in the +X direction) of the base 21 on the opposite side to the cut in the −X direction where the fin section is caused, and the other support arm 30b is provided with the fixing section 39 having a function as the support structure for the quartz-crystal vibrating reed 50, shorter than the one support arm 30, and provided with no receiving section on the tip side thereof. Thus, if the vibrating arm 22 is significantly displaced in the +X direction, the direction in which the tensile stress is applied to the fin section, the displacement of the vibrating arm 22 is limited by the receiving section 35, and thus, it is possible to prevent that a crack is caused in the fin section having a particularly weak impact resistance or the fin section is broken.

Here, since the corner section 42A of the inside wall of the cut 41A forming a pair together with the cut 41B on the −X side to which the fin section is inevitably provided has no fin section caused, and the deterioration of the strength is hardly caused therein, there is no need to provide the receiving section to the other support arm 30b disposed on the −X side of the base 21, and therefore, the support arm 30b can have a short length. Therefore, the quartz-crystal vibrating reed 50 can be made small-sized and superior in the impact resistance compared to the configuration of disposing the support arms 30 each having the receiving section 35 on the both sides of the vibrating arms 22.

Although the embodiment of the invention made by the inventors is hereinabove explained specifically, the invention is not limited to the embodiment described above, but can variously be modified within the scope or the spirit of the invention.

For example, in the embodiment and the modified example described above the quartz-crystal vibrating reeds 20, 50 with the configurations each having the base 21 provided with the cuts 41A, 41B having the vibration leakage prevention effect are explained as the embodiments remarkably providing the advantages of the invention. The invention is not limited thereto, but the improvement of the shock absorbing property can also be achieved even in the configuration in which no cuts are provided to the base, namely in the vibrating reed having a narrow width in the direction identical to the vibration direction of the vibrating arm of the base and low rigidity, for example.

Further, although in the embodiment and the modified example described above the quartz-crystal vibrating reeds 20, 50 each provided with the elongate grooves 26a, 26b and the weight section 29 are explained as an example, even the vibrating reed having the configuration without these constituents can obtain the advantages of the invention.

Further, in the embodiment and the modified example described above the configuration having the shock absorbing member 38 disposed in the contact portion of the receiving section 35 with the vibrating arm 22 in the support arm 30 provided with the receiving section 35 is explained. The invention is not limited thereto, and even if the configuration without the shock absorbing member 38 is adopted, the advantage of improving the impact resistance compared to the vibrating reed having the configuration without the receiving section 35 can be obtained.

Further, regarding the returning section 35a disposed on the tip side of the receiving section 35 of the support arm 30, it is also possible to adopt the configuration without this constituent.

Further, in the embodiment described above, the quartz-crystal vibrating reed 20 of the flexural vibration mode is explained as an example. The invention is not limited thereto, but also in the vibrating reed of a vibration mode other than the flexural vibration mode, such as a torsional vibration mode or a shear vibration mode, the advantage substantially the same as that of the embodiment and the modified example described above such as the improvement of the impact resistance can be obtained by providing the characteristic configuration of the invention.

Further, in the embodiment and the modified example described above, the embodiment and the modified example of the invention in the so-called tuning-fork quartz-crystal vibrating reeds 20, 50 each formed by making the two vibrating arms 22 extend from the base 21 in parallel to each other are explained. The invention is not limited thereto, but even in the case with a so-called beam vibrating reed composed only of one vibrating arm having the base to be the fixed end, or with a vibrating reed provided with three or more vibrating arms, the advantage substantially the same as that of the embodiment and the modified example described above can be obtained.

Although in the embodiment and the modified example described above the quartz-crystal vibrating reeds 20, 50 made of a quartz crystal as one of piezoelectric materials are explained, the invention is not limited thereto, but the vibrating reed can be made of a piezoelectric material other than the quartz crystal, such as lithium tantalate or lithium niobate. Further, in the case with the vibrating reed made of a material other than the piezoelectric materials, such as a silicon semiconductor, an advantage substantially the same as that of the embodiment and the modified example described above can be obtained.

The quartz-crystal vibrating reeds 20, 50 explained in the embodiment and the modified example described above can be applied to the piezoelectric devices and various electronic components other than the piezoelectric devices. In particular, in an oscillator configured by bonding either one of the quartz-crystal vibrating reeds 20, 50 described above inside the package using the support arms 30 as the fixing sections, and further incorporating at least oscillator circuit elements for oscillating the quartz-crystal vibrating reed 20, 50, increase in the CI value, drop of the Q-value, and the vibration leakage can be prevented to thereby realize higher performance thereof and achieve downsizing thereof.

Second Embodiment

Figure 5:
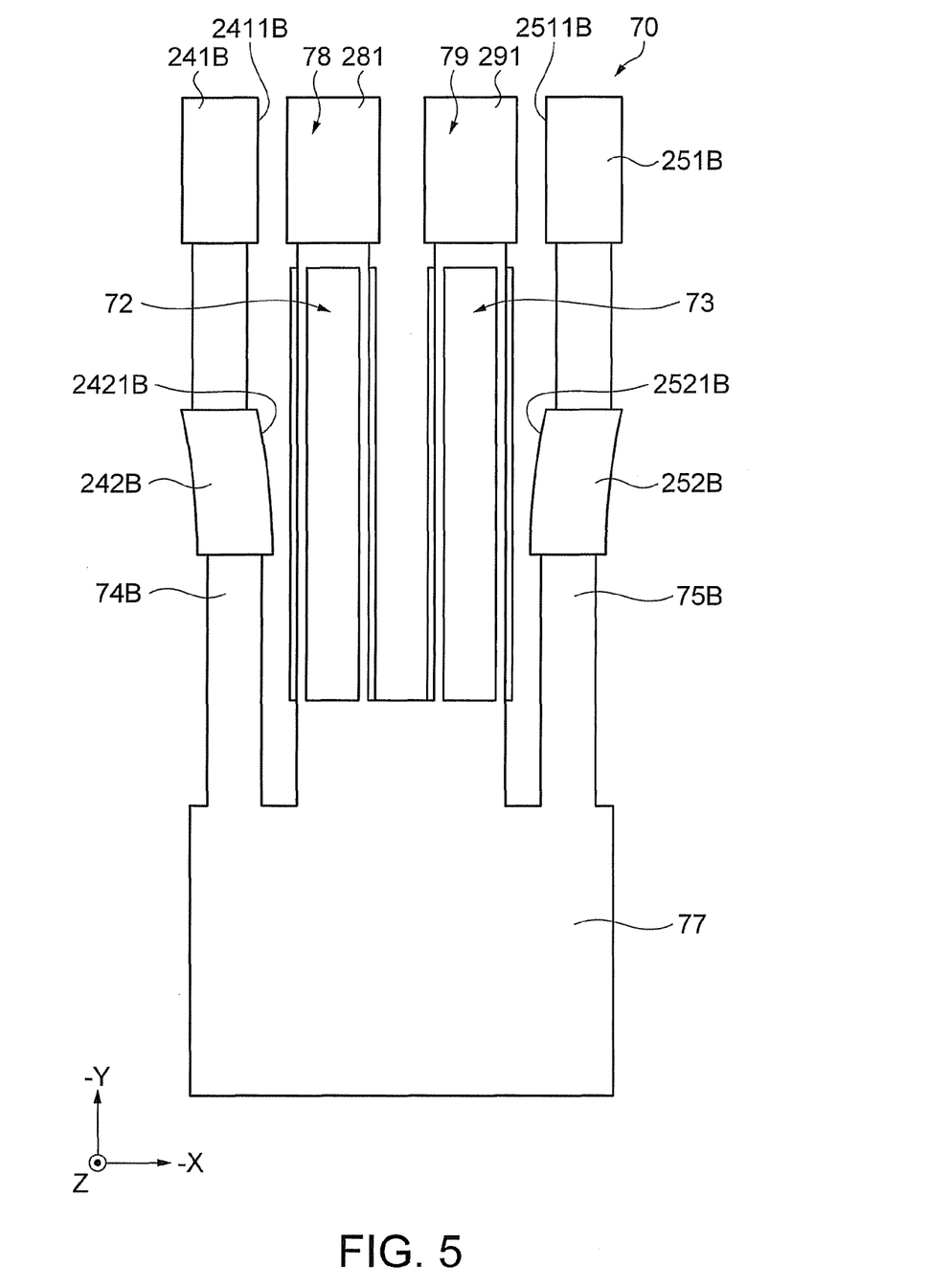
FIG. 5 is a plan view for schematically explaining a quartz-crystal vibrating reed as the vibrating reed according to a second embodiment.

A quartz-crystal vibrating reed as the vibrating reed according to the second embodiment will hereinafter be explained. FIG. 5 is a plan view showing the quartz-crystal vibrating reed according to the second embodiment.

Regarding the quartz-crystal vibrating reed according to the second embodiment explained hereinafter, the differences from the embodiment described above will mainly be explained, and the explanation for the items similar thereto will be omitted.

The quartz-crystal vibrating reed 70 according to the present embodiment is provided with two vibrating arms 78, 79 extending from an end of the base 77, and a pair of (two) support arms (outer arm sections) 74B, 75B respectively disposed on both of the outer sides in the X-axis direction with respect to the vibrating arms 78, 79 in parallel to the vibrating arms 78, 79. The two vibrating arms 78, 79 are respectively provided with bottomed elongate grooves 72, 73 having opening sections on the respective principal surfaces. The two support arms 74B, 75B are disposed so as to extend from the base 77 in the Y-axis direction and arranged in the X-axis direction.

In the present embodiment, the support arms 74B, 75B are set to have lengths with which the tip portions thereof are opposed to the tip portions of the vibrating arms 78, 79.

Further, the distance between the support arms 74B, 75B on the tip side is arranged to be wider than that on the base side thereof.

Further, the tip portion of the support arm 74B is provided with a receiving section (a buffering section) 241B having a shock absorbing property, and the middle of the support arm 74B is also provided with a receiving section (a buffering section) 242B having a shock absorbing property. Similarly, the tip portion of the support arm 75B is provided with a receiving section (a buffering section) 251B having a shock absorbing property, and the middle of the support arm 75B is also provided with a receiving section (a buffering section) 252B having a shock absorbing property.

The receiving sections (the buffering sections) 241B, 242B are formed so that the width dimension of the support arm 74B becomes larger to thereby narrow the distance between the support arm 74B and the vibrating arm 78. In other words, the receiving sections (the buffering sections) 241B, 242B are each formed as a salient section disposed on the support arm 74B shaped like a projection along a direction from the support arm 74B toward the vibrating arm 78. Similarly, the receiving sections (the buffering sections) 251B, 252B are formed so that the width dimension of the support arm 75B becomes larger to thereby narrow the distance between the support arm 75B and the vibrating arm 79. In other words, the receiving sections (the buffering sections) 251B, 252B are each formed as a salient section disposed on the support arm 75B shaped like a projection along a direction from the support arm 75B toward the vibrating arm 79. It should be noted that although the receiving sections (the buffering sections) 241B, 242B, 251B, and 252B of the present embodiment each has the configuration provided with salient sections on the support arms 74B, 75B also in the opposite directions to the directions from the support arms 74B, 75B toward the vibrating arms 78, 79, respectively, it is possible to adopt the configuration provided with the salient sections only in the directions from the support arms 74B, 75B toward the vibrating arms 78, 79, respectively.

Here, the receiving sections (the buffering sections) 241B, 251B on the tip portions of the support arms 74B, 75B, and the receiving sections 242B, 252B of the middle portions thereof are disposed distant from the respective vibrating arms 78, 79, and each forms a blocking section (a limiting section) for having contact with at least one of the vibrating arms 78, 79 when the respective vibrating arms 78, 79 are bending-deformed in the X-axis direction to thereby block (limit) the further bending deformation.

In other words, the receiving sections 241B, 251B, 242B, and 252B are disposed outside the vibrational amplitude range of the normal vibration of adjacent one of the vibrating arms 78, 79, and at the same time, the receiving sections 241B, 251B, 242B, and 252B are disposed at positions having contact with the respective vibrating arms 78, 79 if the displacement exceeding the normal vibrational amplitude range as much as a predetermined amount is caused in adjacent one of the vibrating arms 78, 79, respectively.

It should be noted that the vibrational amplitude range of the normal vibration of each of the vibrating arms 78, 79 described above denotes, similarly to the embodiment described above, the vibrational range of each of the vibrating arms 78, 79 when the vibrational amplitude of each of the vibrating arms 78, 79 vibrating at a predetermined resonant frequency due to application of the drive voltage (electrical field) from the outside becomes the maximum. In other words, the receiving sections 241B, 251B, 242B, and 252B are disposed so as not to have contact with adjacent one of the vibrating arms 78, 79 even when the vibrational amplitude of the vibrating arms 78, 79 vibrating at the predetermined resonant frequency becomes the maximum.

A portion 2411B of the receiving section 241B on the side of the vibrating arm 78 disposed in the tip portion of the support arm 74B has contact with the vibrating arm 78 when the bending deformation in the X-axis direction toward the support arm 74B exceeding the vibrational amplitude range of the normal vibration is caused in the vibrating arm 78. At the same time, a portion 2421B of the receiving section 242B on the side of the vibrating arm 78 disposed in the middle of the support arm 74B has contact with the vibrating arm 78 when the bending deformation in the X-axis direction toward the support arm 74B is caused in the vibrating arm 78.

Similarly, a portion 2511B of the receiving section 251B on the side of the vibrating arm 79 disposed in the tip portion of the support arm 75B has contact with the vibrating arm 79 when the bending deformation in the X-axis direction toward the support arm 74B exceeding the vibrational amplitude range of the normal vibration is caused in the vibrating arm 79. At the same time, a portion 2521B of the receiving section 252B on the side of the vibrating arm 79 disposed in the middle of the support arm 75B has contact with the vibrating arm 79 when the bending deformation in the X-axis direction toward the support arm 75B is caused in the vibrating arm 79.

As described above, the portions 2411B, 2421B, 2511B, and 2521B (the blocking sections) of the support arms 74B, 75B are configured to have contact with the respective vibrating arms 78, 79 at a plurality of positions in the longitudinal direction of the respective vibrating arms 78, 79 due to the bending deformation of the respective vibrating arms 78, 79 described above. Thus, it becomes possible to prevent or reduce the impact applied locally to the vibrating arms 78, 79 when the vibrating arms 78, 79 and the portions 2411B, 2421B, 2511B, and 2521B (the blocking sections) of the support arms 74B, 75B have contact with each other.

Further, the portions 2421B, 2521B in the middle (the blocking sections) of the support arms 74B, 75B each forms a convexity of the curve convex toward the vibrating arms 78, 79. Therefore, the portion 2421B in the middle (the blocking section) of the support arm 74B has surface-contact with the vibrating arm 78 due to the bending deformation of the vibrating arm 78 described above. Similarly, the portion 2521B in the middle (the blocking section) of the support arm 75B has surface-contact with the vibrating arm 79 due to the bending deformation of the vibrating arm 79 described above. Thus, it becomes possible to prevent or reduce the impact applied locally to the vibrating arms 78, 79 when the vibrating arms 78, 79 and the portions 2421B, 2521B in the middle (the blocking sections) of the support arms 74B, 75B have contact with each other.

According to the second embodiment described hereinabove, substantially the same advantage as in the first embodiment described above can be obtained.

Third Embodiment

Then, as a third embodiment a vibrator equipped with the quartz-crystal vibrating reed as the vibrating reed explained in the embodiments described above will be explained.

Figure 6A:
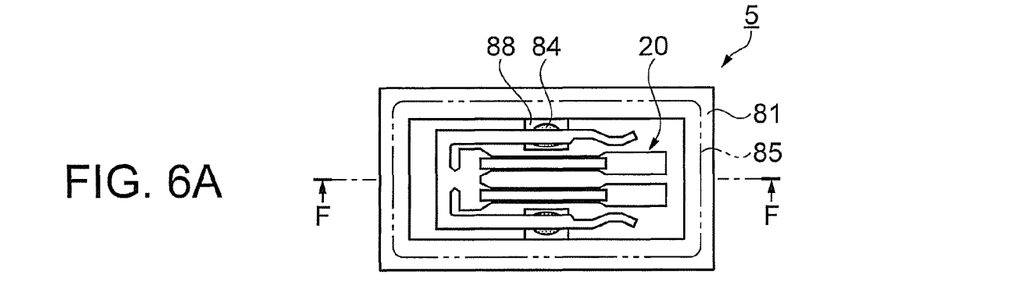
FIG. 6A is a plan view.
Figure 6B:
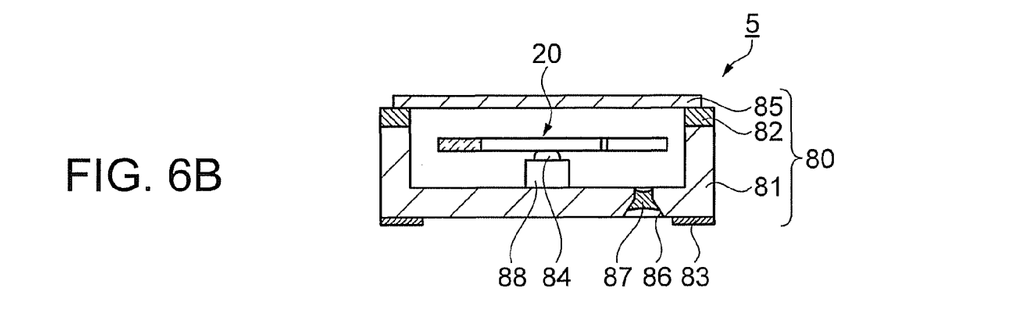
FIG. 6B is a cross-sectional view along the line F-F shown in FIG. 6A.

FIGS. 6A and 6B are schematic diagrams showing a rough configuration of a vibrator according to a third embodiment, wherein FIG. 6A is a plan view, and FIG. 6B is a cross-sectional view along the line F-F shown in FIG. 6A. It should be noted that in the present embodiment, the configuration using the quartz-crystal vibrating reed 20 as the vibrating reed explained in the first embodiment described above as an example will be presented and explained.

As shown in FIGS. 6A and 6B, a quartz-crystal vibrator 5 as the vibrator is provided with the quartz-crystal vibrating reed 20 according to the first embodiment, and a package 80 for housing the quartz-crystal vibrating reed 20. The package 80 is mainly composed of a package base 81, a seam ring 82, and a lid member 85. The package base 81 is provided with a recessed section so that the quartz-crystal vibrating reed 20 can be housed, and two connecting pads 88 to be connected to mounting electrodes not shown of the quartz-crystal vibrating reed 20 are disposed to the recessed section at respective two places. The connecting pads 88 are connected to the wiring in the package base 81, and are configured to be electrically connectable to external connection terminals 83 disposed on the periphery of the package base 81.

On the periphery of the recessed portion of the package base 81, there is disposed the seam ring 82. Further, the bottom section of the package base 81 is provided with a through hole 86. The quartz-crystal vibrating reed 20 is fixed by bonding to the connecting pads 88 of the package base 81 via an electrically conductive adhesive 84. Further, the package 80 is formed by seam-welding the lid member 85 for covering the recessed portion of the package base 81 and the seam ring 82 with each other. The through hole 86 of the package base 81 is filled with a sealing member 87 made of a metal material and so on. The sealing member 87 is melted and then solidified in the reduced-pressure atmosphere, and air-tightly seals the through hole 86 so that the reduced-pressure state can be kept inside the package base 81. The quartz-crystal vibrating reed 20 is excited by the drive signal from the outside via the external connection terminals 83, and the quartz-crystal vibrator 5 oscillates (resonates) at a predetermined frequency (e.g., 32 kHz).

As described above, since the quartz-crystal vibrator 5 is equipped with the quartz-crystal vibrating reed 20 explained in the embodiment described above, it becomes possible to provide the quartz-crystal vibrator 5 having a stable vibration characteristic and a high impact resistance.

It should be noted that even if the vibrating reed of another type, such as the quartz-crystal vibrating reed 70, is used instead of the quartz-crystal vibrating reed 20 in the quartz-crystal vibrator 5, substantially the same advantages can be obtained.

Further, although the present embodiment is explained with the configuration of fixing the quartz-crystal vibrating reed 20 to the connecting pads 88 disposed at the two places, the number of places of the connection pads 88 is not limited to two, but can be a desired number, and the connection to the quartz-crystal vibrating reed 20 can be performed at a desired number of connection places.

Fourth Embodiment

Then, as a fourth embodiment an oscillator equipped with the quartz-crystal vibrating reed as the vibrating reed explained above will be explained.

Figure 7A:
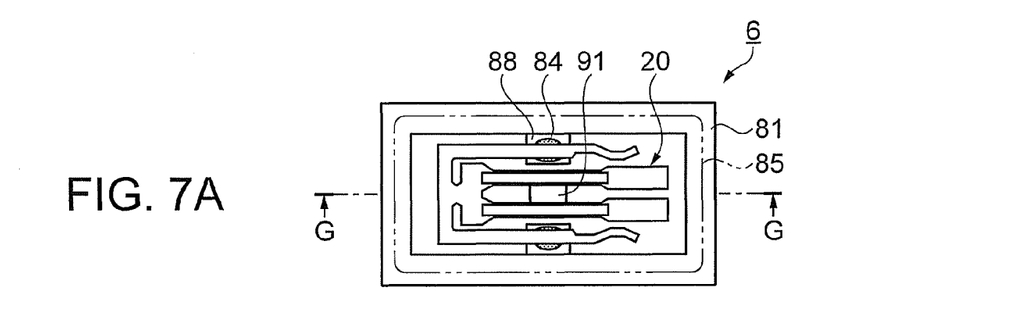
FIG. 7A is a plan view.
Figure 7B:
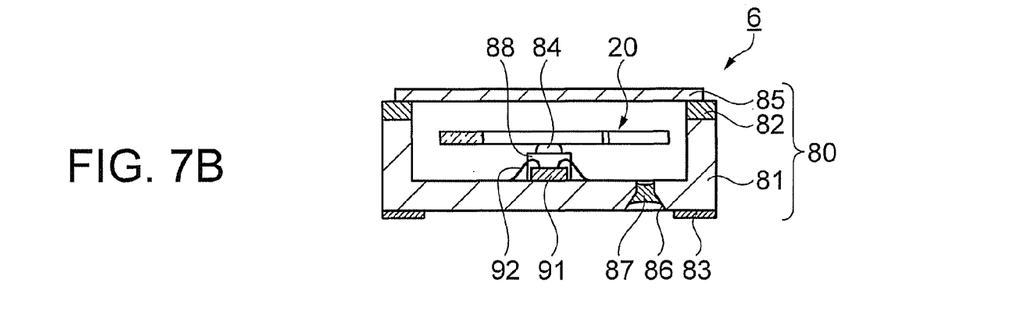
FIG. 7B is a cross-sectional view along the line G-G shown in FIG. 7A.

FIGS. 7A and 7B are schematic diagrams showing a rough configuration of the oscillator according to the fourth embodiment, wherein FIG. 7A is a plan view, and FIG. 7B is a cross-sectional view along the line G-G shown in FIG. 7A. It should be noted that in the present embodiment, the configuration using the quartz-crystal vibrating reed 20 as the vibrating reed explained in the first embodiment described above as an example will be presented and explained.

A quartz-crystal oscillator 6 as the oscillator has a configuration obtained by further providing circuit elements to the configuration of the quartz-crystal vibrator 5. It should be noted that the constituents common to the quartz-crystal vibrator 5 will be denoted with the same reference numerals, and the detailed explanation therefor will be omitted.

As shown in FIGS. 7A and 7B, the quartz-crystal oscillator 6 is provided with the quartz-crystal vibrating reed 20 according to the first embodiment, an IC chip 91 as a circuit element including the oscillator circuit for oscillating the quartz-crystal vibrating reed 20, and a package 80 for housing the quartz-crystal vibrating reed 20 and the IC chip 91. The IC chip 91 is fixed tightly to the bottom section of the package base 81, and is connected to other wiring via metal wires 92 such as gold wires. The quartz-crystal vibrating reed 20 is excited by the drive signal from the oscillator circuit of the IC chip 91, and the quartz-crystal oscillator 6 oscillates (resonates) at a predetermined frequency (e.g., 32 kHz).

As described above, since the quartz-crystal oscillator 6 is equipped with the quartz-crystal vibrating reed 20 explained in the embodiment described above, it becomes possible to provide the quartz-crystal oscillator 6 having a stable vibration characteristic and a high impact resistance.

It should be noted that even if the quartz-crystal vibrating reed 70 is used instead of the quartz-crystal vibrating reed 20 in the quartz-crystal oscillator 6, substantially the same advantages can be obtained.

Further, although the present embodiment is explained with the configuration of fixing the quartz-crystal vibrating reed 20 to the connecting pads 88 disposed at the two places, the number of places of the connection pads 88 is not limited to two, but can be a desired number, and the connection to the quartz-crystal vibrating reed 20 can be performed at a desired number of connection places.

Since the quartz-crystal vibrating reeds 20, 70 as the vibrating reeds described above are each provided with the receiving section for limiting the displacement of the vibrating arm while reducing the impact in the case in which a significant displacement is caused in the vibrating arm due to the impact such as dropping, it is possible to maintain the stable vibration characteristic while assuring the impact resistance.

Therefore, the quartz-crystal vibrator 5 or the quartz-crystal oscillator 6 incorporating the quartz-crystal vibrating reeds 20, 70 as a package is used as, for example, a timing device widely in the electronic devices such as digital cellular phones, personal computers, electronic timepieces, video cassette recorders, or television sets. Further, the quartz-crystal vibrator 5 and the quartz-crystal oscillator 6 can preferably be used for downsizing of these electronic devices, and in particular for portable equipment required to have an impact resistance.

The entire disclosure of Japanese Patent Application Nos: 2009-216634, filed Sep. 18, 2009, 2010-159503, filed Jul. 14, 2010 and 2010-068997, filed Mar. 24, 2010 are expressly incorporated by reference herein.

What is claimed is:

1. A vibrating reed comprising:
   a base;
   a vibrating arm extending from the base;
   a support arm extending from the base, and at least a part of the support arm being parallel to the vibrating arm;
   a receiving section formed of a part of the support arm; and
   a contact portion is provided at the receiving section, wherein
   the receiving section projecting toward the vibrating arm so that a distance between the vibrating arm and the receiving section is smaller than a distance between the vibrating arm and the other part of the support arm, and
   the contact portion is a shock absorbing member.

2. The vibrating reed according to claim 1, wherein
   the receiving section is opposite to the vibrating arm,
   the receiving section is disposed outside a vibrational amplitude range of normal vibration of the vibrating arm caused by an electric field applied externally, and
   the receiving section is located at a position where the vibrating arm has contact with the receiving section when the vibrating arm is displaced beyond the vibrational amplitude range of the normal vibration.

3. The vibrating reed according to claim 1, wherein
   the receiving section is disposed on a tip side of the support arm.

4. The vibrating reed according to claim 1, wherein
   two or more of the receiving sections are disposed on the support arm, and are configured so as to have contact with the vibrating arm at two or more positions in a longitudinal direction of the vibrating arm due to bending deformation of the vibrating arm.

5. The vibrating reed according to claim 1, wherein
   the vibrating arm has both principal surfaces and both side surfaces connecting the both principal surfaces to each other and extending in a longitudinal direction of the vibrating arm,
   the vibrating arm is further provided with at least one bottomed elongate groove having an opening on at least one of the both principal surfaces and extending along the longitudinal direction of the vibrating arm, and
   the contact portion is located at a position with which the vibrating arm contacts when the vibrating arm is displaced beyond a vibrational amplitude ran of normal vibration, and the contact portion is located near a tip side of the support arm.

6. The vibrating reed according to claim 1, wherein
   a weight section having a width larger than that of the vibrating arm close to the base is disposed on a tip side of the vibrating arm, and
   when the vibrating arm is displaced beyond a vibrational amplitude range of normal vibration, the contact portion contacts with the weight section.

7. The vibrating reed according to claim 6, wherein
   the contact portion of the receiving section is arranged to have surface-contact with a side surface of the weight section of the vibrating arm.

8. The vibrating reed according to claim 1, wherein
   the support arm has a part having a width smaller than a distance between the both side surfaces of the vibrating arm at a part having the smallest distance.

9. The vibrating reed according to claim 1, wherein
   the support arm is formed so that a width of the receiving section is smaller than a width of the other part of the support arm near the base.

10. The vibrating reed according to claim 1, wherein
    the vibrating reed is a piezoelectric vibrating reed formed of a piezoelectric material.

11. The vibrating reed according to claim 10, wherein
    a quartz crystal is used as the piezoelectric material,
    the base has a pair of cuts arranged in respective directions opposite to each other along one straight line in an X-axis direction in an orthogonal coordinate system constituted by the X axis, Y axis, and Z axis of the quartz crystal so that a constricted shape appears in both principal surfaces of the base,
    the vibrating arm extends in the Y-axis direction from an end of the base located in the Y-axis direction, and
    the support arm having the receiving section is disposed at least on a +X side of the vibrating arm.

12. A vibrator comprising:
    the vibrating reed according to claim 1; and
    a package adapted to house the vibrating reed.

13. An electronic device comprising:
    the vibrator according to claim 12.

14. An oscillator comprising:
    the vibrating reed according to claim 1;
    a circuit element provided with an oscillator circuit adapted to oscillate the vibrating reed; and
    a package adapted to house the vibrating reed and the circuit element.

15. An electronic device comprising:
    the vibrator according to claim 14.

16. An electronic device comprising:
    the vibrating reed according to claim 1.

* * * * *